US008397201B2

(12) United States Patent
Tsai et al.

(10) Patent No.: US 8,397,201 B2
(45) Date of Patent: Mar. 12, 2013

(54) METHOD OF SIMULATING AN ESD CIRCUIT LAYOUT

(75) Inventors: Ching-Ling Tsai, Tainan (TW); Shih-Fan Chen, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 13/208,006

(22) Filed: Aug. 11, 2011

(65) Prior Publication Data

US 2013/0042218 A1    Feb. 14, 2013

(51) Int. Cl.
*G06F 17/50* (2006.01)

(52) U.S. Cl. ............... 716/136; 716/112; 716/115

(58) Field of Classification Search .......... 716/136, 716/112, 115

See application file for complete search history.

(56) References Cited

U.S. PATENT DOCUMENTS 7,103,866 B2 *  9/2006  Kashiwagi et al. ........... 716/120
7,694,247 B2 *  4/2010  Esmark et al. ............... 716/136

* cited by examiner

*Primary Examiner* — Vuthe Siek

(74) *Attorney, Agent, or Firm* — Stout, Uxa, Buyan & Mullins, LLP

(57) ABSTRACT

A method of simulating an electrostatic discharge (ESD) circuit layout is disclosed. A netlist of an electronic circuit is pre-simulated. A circuit layout, including an ESD circuit layout, is accordingly generated. Parasitic is extracted according to the generated circuit layout. The ESD circuit layout is post-simulated according to an ESD waveform and a result of the parasitic extraction.

11 Claims, 3 Drawing Sheets

METHOD OF SIMULATING AN ESD CIRCUIT LAYOUT

BACKGROUND OF THE INVENTION

1. Field of the Invention

The present invention generally relates to electrostatic discharge (ESD), and more particularly to a simulation method for an ESD circuit layout.

2. Description of Related Art

Electrostatic discharge (ESD) is harmful to integrated circuits made of semiconductor materials such as silicon and silicon oxide, which may be permanently damaged by a sudden and brief current or voltage. Accordingly, integrated circuits are commonly equipped with ESD protection circuits and need to be subjected to various ESD tests during their designing and manufacturing processes for verifying their resistance level or insusceptibility to ESD. The human-body model (HBM) is one commonly used test model for characterizing ESD that imitates a human's touch on an integrated circuit, and machine model (MM) is another one that imitates a machine's contact with the integrated circuit.

As those in the field well know, it is most advantageous and affordable to have defective ESD circuits uncovered as early as possible during the designing and manufacturing process. Unfortunately, most test schemes fail to opportunely identify defective ESD circuits as even they can pass the circuit functionality test.

As a result, defective ESD circuits usually cannot be successfully detected until the manufactured (i.e., physical) integrated circuits burn out while being subjected to ESD testing. At that time, the photomask used for manufacturing the integrated circuits is discarded, the circuit layout is modified, a new photomask is prepared and used to manufacture the integrated circuits again, and the newly manufactured integrated circuits are once again subjected to ESD testing. The procedure mentioned above will need to be iterated again and again until the integrated circuits eventually pass the ESD test.

For the foregoing reasons, a need has arisen to propose a novel method for simulating an ESD circuit layout in an effective, economic and expedient manner.

SUMMARY OF THE INVENTION

In view of the foregoing, it is an object of the embodiment of the present invention to provide a method of simulating an electrostatic discharge (ESD) circuit layout that facilitates identifying defective back-end layers before the circuit layout tapes out, thereby avoiding faulty and costly photomasks and integrated circuits from being made.

According to one embodiment, a netlist that describes connectivity among components in an electronic circuit is provided. The netlist is pre-simulated for modeling of circuit operation. A circuit layout, including an ESD circuit layout, corresponding to the electronic circuit is generated according to a result of the pre-simulation. Parasitic is extracted according to the generated circuit layout. An ESD waveform is provided for simulating the ESD circuit layout, and the ESD circuit layout is post-simulated according to the ESD waveform and a result of the parasitic extraction.

DETAILED DESCRIPTION OF THE INVENTION

Figure 1:
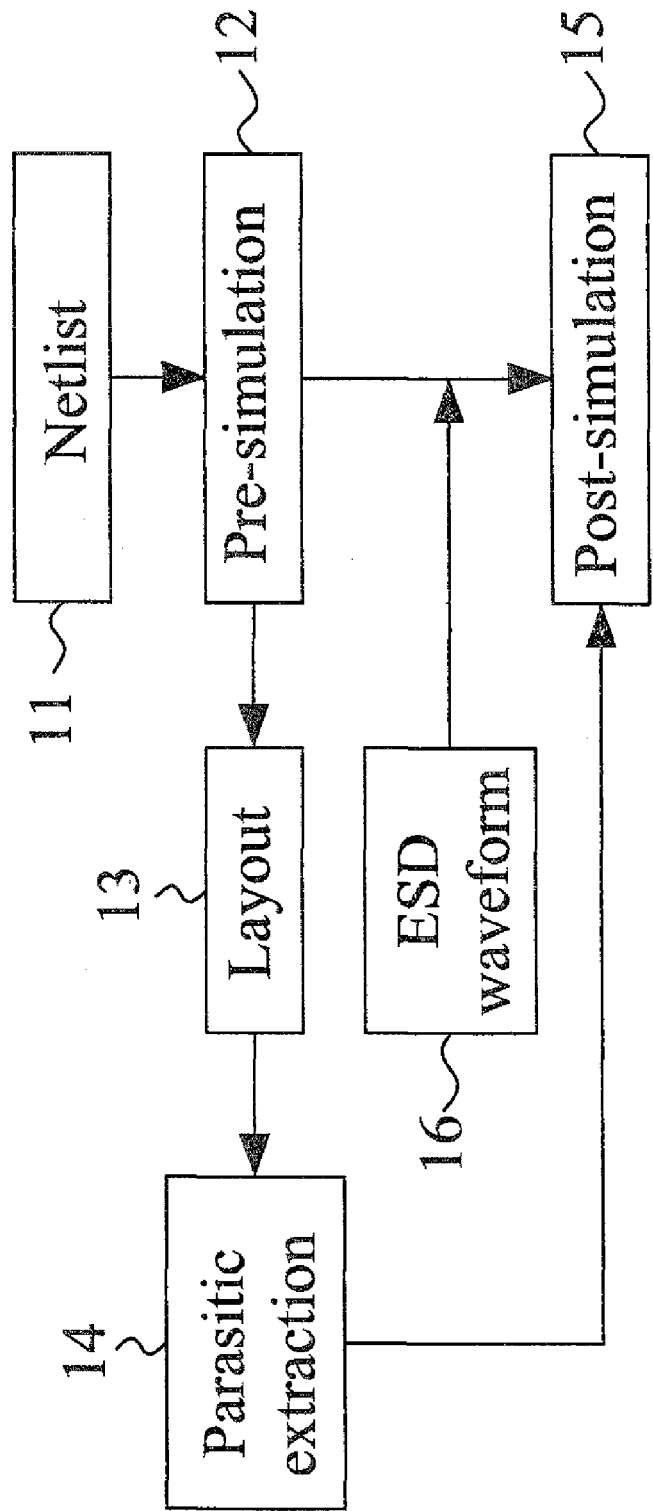
FIG. 1 shows a flow diagram illustrating a method of simulating an electrostatic discharge (ESD) circuit layout according to one embodiment of the present invention.

Referring more particularly to the drawings, FIG. 1 is a flow diagram illustrating a method of simulating an electrostatic discharge (ESD) circuit layout according to one embodiment of the present invention.

In step 11, a netlist that describes the connectivity among components (or instances) in an electronic circuit is first provided. Next, in step 12, the netlist is fed to a transistor-level circuit simulation tool, such as HSIM provided by Synopsys, Inc., for modeling of circuit operation in order to simulate (or verify) a circuit's behavior. In the specification, the verification performed in step 12 is also called pre-simulation (or simply pre-sim).

Subsequently, in step 13, the result of the pre-simulation is utilized to generate a circuit layout (including an ESD circuit layout), which is represented in terms of shapes that correspond to patterns of a variety of layers making up the circuit. The layers in fabricating semiconductor devices are commonly classified into two types: front-end layers and back-end layers. The front-end layers (e.g., well and P/N formation) concern, fabricating individual components, and the back-end layers (e.g., metal, via and contact) concern connecting the individual components. It is observed that a defective ESD circuit most often burns out at the back-end layers, for example, due to narrow width of the metal layers, or insufficient quantity or inappropriate locations of the contacts or the vias.

In step 14, parasitic extraction (commonly called RC extraction is performed according to the generated circuit layout to obtain parasitic effects (e.g., parasitic capacitances (C) and parasitic resistances (R)). Therefore, an accurate analog model of the circuit may be created, according to which the circuit can be accurately tested in both digital and analog domains. The extracted parasitic may be represented in a Detailed Standard Parasitic Format (DSPF) file. Further, a layout versus schematic (LVS) tool, which may be included in the same simulation tool such as HSIM, is used to verify whether the circuit layout matches the netlist. A layout engineer needs to make changes to the circuit layout until the circuit layout passes the LVS.

Afterwards, in step 15, a further simulation (also called post-simulation or simply post-sim) is performed on the ESD circuit layout, for example, by HSIM provided by Synopsys, Inc. according to the output (i.e., the verified netlist) from step 12, the output (i.e., DSPF file) from step 14 and an ESD waveform provided in step 16 for simulating the ESD circuit. More particularly, the back-end layers such as metal layers, vias and contacts are subjected to post-simulation in the embodiment. The ESD waveform provided in step 16 may be one of standard. ESD waveforms that are commonly used to verify the ESD circuit.

Figure 2A:
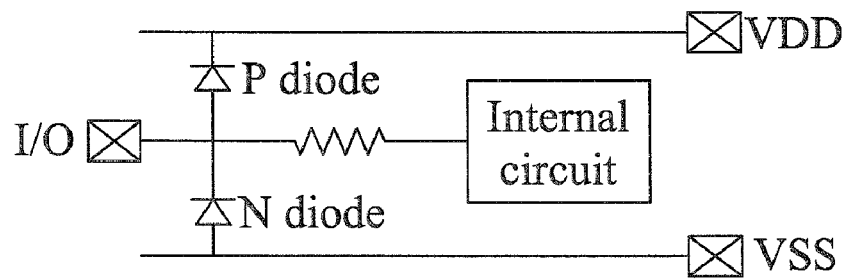
FIG. 2A shows an exemplary ESD circuit made of an N diode and a P diode.

FIG. 2A shows an exemplary ESD circuit made of an N diode and a P diode. An input/output pad (I/O), a power pad (VDD) and a ground pad (VSS) are also shown in the figure. In case that a voltage greater than VDD is applied, at the I/O pad, the P diode is forward biased and conducted, thus protecting the internal circuit 20 from being damaged. Similarly, in case that a voltage less than VSS is applied at the I/O pad, the N diode is forward biased and conducted, thus protecting the internal circuit 20 from being damaged.

Figure 2B:
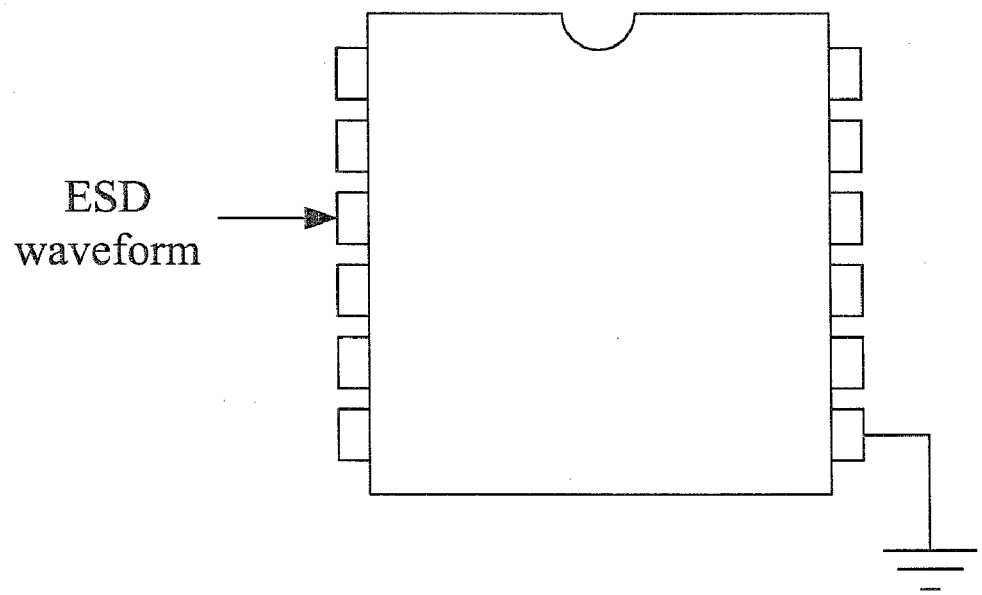
FIG. 2B schematically shows an integrated, circuit with an ESD path formed by coupling one pad with an ESD waveform and grounding another pad.

In the embodiment, any two pads of the circuit may be subjected to ESD simulation (i.e., post-sim) by respectively coupling to the ESD waveform and being grounded, thereby forming an ESD path whose reliability is to be verified. FIG. 2B schematically shows an integrated circuit with an ESD path formed through the ESD circuit by coupling one pad (denoted as ESD_In) with an ESD waveform and grounding another pad (denoted as ESD_Out). The pads in each said. ESD path may be either a power pad (e.g., VDD), a ground pad (e.g., VSS) or an I/O pad. Generally speaking, the following ESD paths may be established: (1) power/ground pad to power/ground pad, (2) I/O pad to power/ground pad, or vice versa, and (3) I/O pad to I/O pad.

Figure 3:
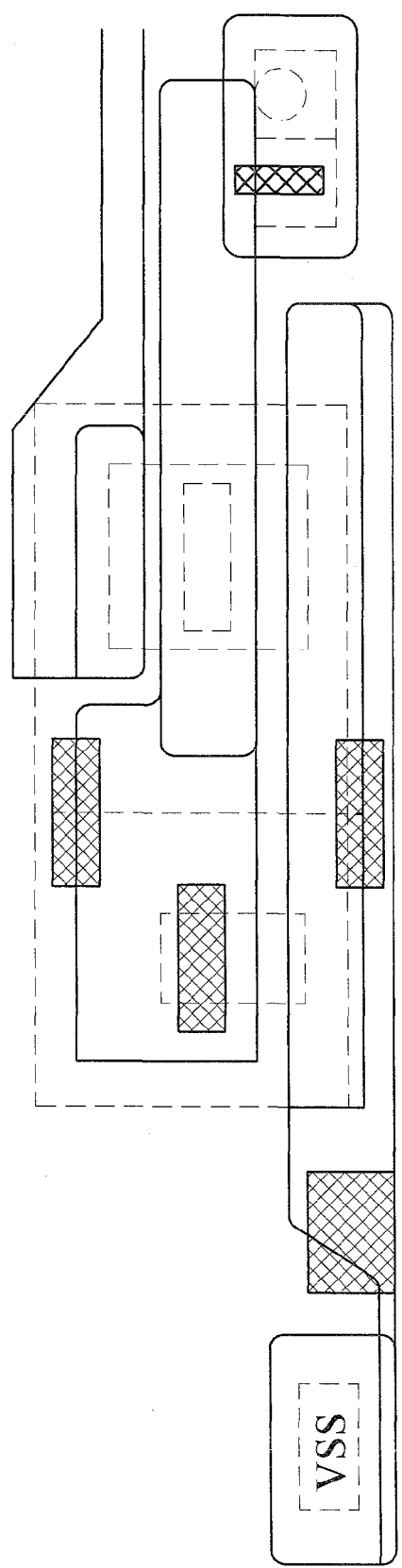
FIG. 3 schematically shows an exemplary circuit layout, upon which the reported current segments are visually displayed.

With respect to each ESD path, the simulation tool responsible for the post-sim responds by reporting corresponding currents passing through the metal layers, respectively. In the embodiment, with respect to each metal layer in the circuit layout diagram, the reported current is compared with a corresponding given rated current. The comparing results of the metal layers may be ranked and then visually expressed with a color scale that is divided into several sections represented by different colors associated with different ranks, respectively. For example, the metal layer that has a reported current equal or greater than the corresponding rated current is highlighted with red, and the metal layer that has a reported current substantially less than the corresponding rated current is visually expressed with green. FIG. 3 schematically shows an exemplary circuit layout (denoted by broken lines), upon which the reported current segments (denoted by solid lines) are visually displayed. In the drawing, the areas highlighted by hatched lines indicate that the reported current is equal or greater than the corresponding rated current. In case that a metal layer expressed in red (e.g., the hatched area) occurs, the layout engineer may make changes to, for example, the width of the metal layer, or the quantity or locations of vias or contacts according to the comparing result (e.g., the ratio of the reported current and the rated current).

According to the embodiment, the specific region of a defective ESD circuit layout can be detected before layout data tapes out or a physical layout photomask is made. Accordingly, lots of manpower and corresponding cost can be reduced. Moreover, in case of finding the defective ESD circuit layout, the layout engineer can modify the back-end layers according to the comparing result in a quantitative manner; to the contrary, in case of burning the ESD circuit using the conventional scheme, the layout engineer can modify the ESD circuit layout only according to his or her experience.

Although specific embodiments have been illustrated and described, it will be appreciated by those skilled in the art that various modifications may be made without departing from the scope of the present invention, which is intended to be limited solely by the appended claims.

What is claimed is:

1. A method of simulating an electrostatic discharge (ESD) circuit layout, comprising a computer processor for performing the following steps:

providing a netlist that describes connectivity among components in an electronic circuit;
   pre-simulating the netlist for modeling of circuit operation;
   generating a circuit layout corresponding to the electronic circuit according to a result of the pre-simulation, the generated circuit layout including an ESD circuit layout and a plurality of back-end layers for connecting individual components of the electronic circuit;
   extracting parasitic according to the generated circuit layout;
   providing an ESD waveform for simulating the ESD circuit layout; and
   post-simulating the ESD circuit layout according to the ESD waveform and a result of the parasitic extraction;
   wherein the back-end layers are subjected to the post-simulation and the post-simulation step comprises:
   coupling one of a plurality of pads of the electronic circuit with the ESD waveform and grounding another of the pads, thereby forming an ESD path;
   reporting currents passing through the corresponding back-end layers, respectively;
   comparing the reported current with a corresponding given rated current; and
   highlighting the back-end layer that has the reported current equal or greater than the corresponding rated current.

2. The method of claim 1, wherein the netlist is pre-simulated by a transistor-level circuit simulation tool.

3. The method of claim 1, wherein the back-end layers comprises one or more of the following: metal layers, vias and contacts.

4. The method of claim 1, wherein the extracted parasitics comprise parasitic capacitance and parasitic resistance.

5. The method of claim 1, wherein the extracted parasitic is represented in a Detailed Standard Parasitic Format (DSPF) file.

6. The method of claim 1, in the parasitic extraction step, a layout versus schematic (LVS) tool is used to verify whether the circuit layout matches the netlist.

7. The method of claim 1, wherein the pads in each said ESD path is either a power pad, a ground pad or an input/output (I/O) pad.

8. The method of claim 7, wherein the ESD path is established between (1) two of the power/ground pads, (2) the I/O pad and the power/ground pad, or (3) two of the I/O pads.

9. The method of claim 1, wherein the post-simulation step further comprises:
   ranking the comparing results of the back-end layers; and
   visually expressing the back-end layers with a color scale that is divided into several sections represented by different colors associated with different ranks, respectively.

10. The method of claim 1, wherein the post-simulation step further comprises:
    making change to a width, quantity or a location of the back-end layers according to the comparing results.

11. The method of claim 1, wherein the post-simulation is performed further according to a result of the pre-simulation.

* * * * *